United States Patent
Miyamoto

(10) Patent No.: US 9,196,293 B2
(45) Date of Patent: Nov. 24, 2015

(54) STORAGE APPARATUS, IMAGE FORMING APPARATUS, ABNORMALITY DETECTING METHOD FOR INSTANTANEOUS POWER FAILURE OF HARD DISK, AND ABNORMALITY RECOVERY METHOD THEREOF

(71) Applicant: KYOCERA Document Solutions Inc., Osaka (JP)

(72) Inventor: Naruyuki Miyamoto, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 14/634,778

(22) Filed: Feb. 28, 2015

(65) Prior Publication Data

US 2015/0248920 A1    Sep. 3, 2015

(30) Foreign Application Priority Data

Feb. 28, 2014  (JP) ................................. 2014-038151

(51) Int. Cl.

| | |
|---|---|
| G11B 19/04 | (2006.01) |
| G11B 27/36 | (2006.01) |
| G01R 19/00 | (2006.01) |
| G01R 31/40 | (2014.01) |
| G01R 19/165 | (2006.01) |
| G06F 1/30 | (2006.01) |
| H02H 3/247 | (2006.01) |
| G11B 19/20 | (2006.01) |

(52) U.S. Cl.

CPC .......... *G11B 19/047* (2013.01); *G01R 19/0084* (2013.01); *G01R 19/165* (2013.01); *G01R 31/40* (2013.01); *G06F 1/305* (2013.01); *G11B 27/36* (2013.01); *H02H 3/247* (2013.01); *G11B 19/2081* (2013.01)

(58) Field of Classification Search
None
See application file for complete search history.

(56) References Cited

U.S. PATENT DOCUMENTS 8,593,752 B2 * 11/2013 Kiyonaga et al. ............... 360/68

FOREIGN PATENT DOCUMENTS

| JP | H06-051879 A | 2/1994 |
|---|---|---|
| JP | H11-051985 A | 2/1999 |
| JP | 2002-283661 A | 10/2002 |
| JP | 2005-035227 A | 2/2005 |

* cited by examiner

*Primary Examiner* — Wayne Young
*Assistant Examiner* — Brian Butcher
(74) *Attorney, Agent, or Firm* — Hawaii Patent Services; Nathaniel K. Fedde; Kenton N. Fedde

(57) ABSTRACT

Provided is a storage apparatus that detects abnormalities of a hard disk caused by the instantaneous power failure of a low voltage power supply. An effective value reduction detecting circuit transmits a detection signal, when the voltage of a low voltage power supply is lower than specific voltage. CPU memorizes time t1 to a flash memory. Also, CPU memorizes time t2, when recovering low voltage power supply 13 on proper voltage. Then, CPU computes period of time T, which is time between time t1 and t2. If the computed period of time T is within a range from first period of time T1 to the second period of time T2, CPU operates a voltage switch and re-supply the power supply to the hard disk. If not within the range, CPU does not re-supply power to the hard disk.

5 Claims, 5 Drawing Sheets

STORAGE APPARATUS, IMAGE FORMING APPARATUS, ABNORMALITY DETECTING METHOD FOR INSTANTANEOUS POWER FAILURE OF HARD DISK, AND ABNORMALITY RECOVERY METHOD THEREOF

INCORPORATION BY REFERENCE

This application is based on and claims the benefit of priority from Japanese Patent Application No. 2014-038151 filed on Feb. 28, 2014, the contents of which are hereby incorporated by reference.

BACKGROUND

The present disclosure is related with the detecting method of the abnormalities by the instantaneous power failure of a hard disk.

Following shows typical examples as technology for solving a problem that happens in a hard disk in an instantaneous power failure.

First, in one example, if reduction of an AC input voltage provided to a printer is detected, it will be notified to a controller part and an access operation to the hard disk drive will be stopped.

In another example, a control unit resets a state of the disk interface part by interruption at the time of AC power off. Further, the disk controller of an external storage identifies the reset state of an interface and writes data of one access unit under writing to a hard disk with adding error check code within DC voltage guarantee time.

Also, in the other example, when a digital value of output voltage is less than a desired value, it is determined that AC power supply is intercepted, an input DC voltage of a converter declines, and output voltage will lower soon. In this case, new data to nonvolatile memory is not written in.

Also, in the other example, when a digital value of momentary voltage of an alternating voltage source is greater than or equal to a predetermined threshold, it outputs. In this case, if the period from falling to rising exceeds a first time limit value for this output wave, it determines as the instantaneous power failure. Thereby, main work is interrupted.

SUMMARY

The storage apparatus of the present disclosure is a storage apparatus including a CPU, hard disk that communicates with the CPU, and voltage is supplied to the hard disk from the low voltage power supply. The storage apparatus includes a voltage detecting part, a voltage drop time measuring part, and a hard disk abnormality determining part. The voltage detecting part detects the voltage of the low voltage power supply. The voltage drop time measuring part memorizes time when the voltage detected by the voltage detecting part is less than specified voltage, which is higher than reset voltage of the CPU. The voltage recovery time measuring part memorizes time recovered the voltage of the low voltage power supply to proper voltage. The hard disk abnormality determining part determines the hard disk is abnormal when period from the time memorized in the voltage drop time measuring part to the time memorized in the voltage recovery time measuring part is within the range from a first threshold determined previously to a second threshold determined previously.

An abnormality detecting method by an instantaneous power failure of a hard disk in the present disclosure is a detecting method of the abnormalities by the instantaneous power failure of the hard disk that communicates with a CPU. The detecting method of the abnormalities includes a voltage detection step, a voltage drop time measurement step, and a hard disk abnormality determining step. In the voltage detection step, it detects the voltage of a low voltage power supply provided to the hard disk. In the voltage drop time measurement step, it memorizes time when the voltage detected by the voltage detection step is less than specific voltage, which is higher than reset voltage of the CPU. In the voltage recovery time measurement step, it memorizes time recovered voltage of the low voltage power supply to proper voltage. In the hard disk abnormality determining step, it determines the hard disk is abnormal when period from the time memorized in the voltage drop time measuring part to the time memorized in the voltage recovery time measuring part is within the range from a first threshold determined previously to a second threshold determined previously.

An abnormality recovery method by the instantaneous power failure of the hard disk of the present disclosure is an abnormality recovery method by the instantaneous power failure of the hard disk that communicates with a CPU. The abnormality recovery method comprises a voltage detection step, a voltage drop time measurement step, a hard disk abnormality determining step, and a power supply re-supply step. In the voltage detection step, it detects the voltage of a low voltage power supply provided to the hard disk. In the voltage drop time measurement step, it memorizes time when the voltage detected by the voltage detection step is less than specific voltage, which is higher than reset voltage of the CPU. In the voltage recovery time measurement step, it memorizes time recovered voltage of the low voltage power supply to proper voltage. In the hard disk abnormality determining step, it determines the hard disk is abnormal when period from the time memorized in the voltage drop time measuring part to the time memorized in the voltage recovery time measuring part is within the range from a first threshold determined previously to a second threshold determined previously. In the power supply re-supply step, it supplies the power supply to the hard disk again if determining the hard disk is abnormal by the hard disk abnormality determining step.

DETAILED DESCRIPTION

Embodiment

[The Configuration of Image Forming Apparatus 1]

Figure 1:
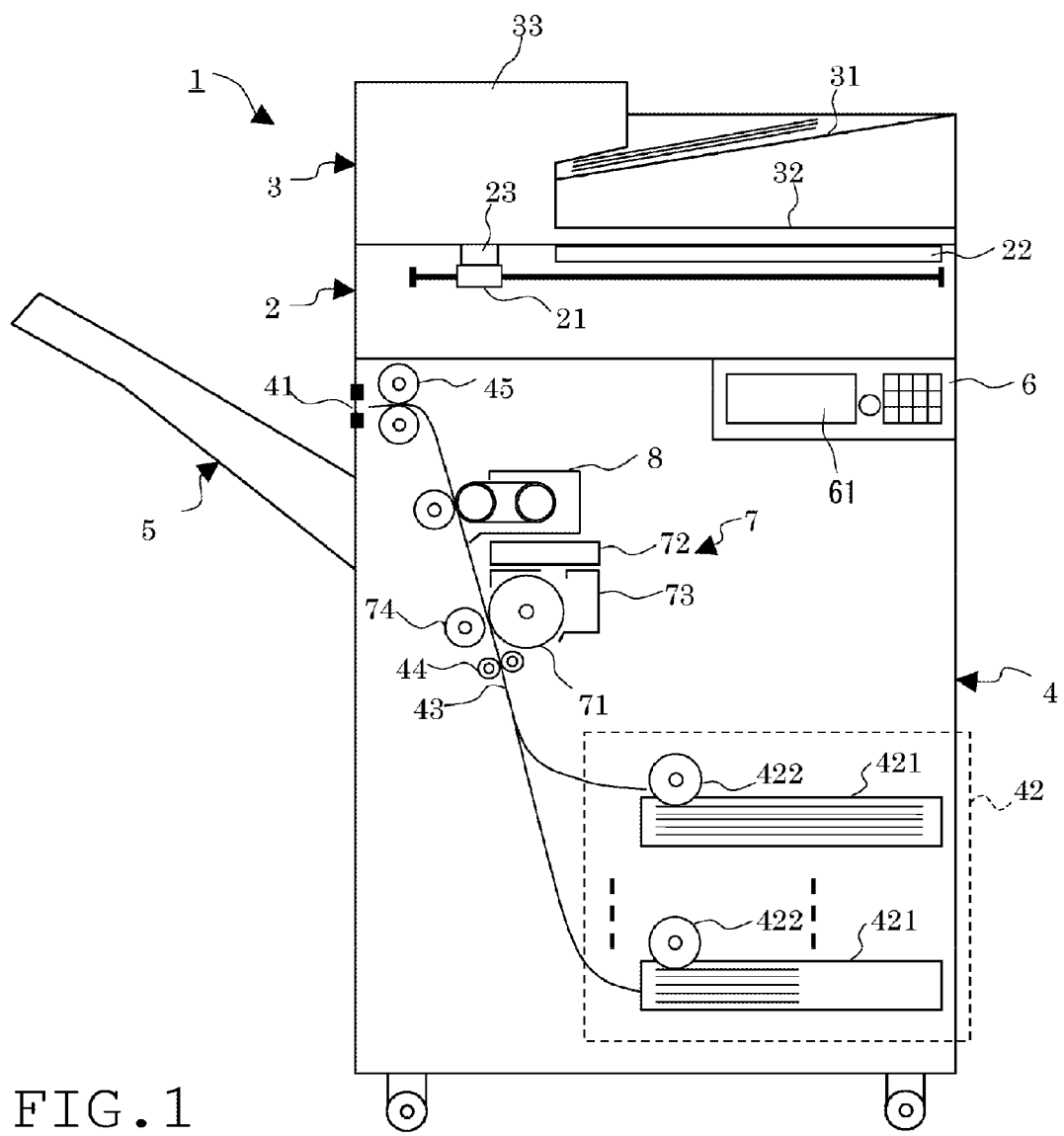
FIG. 1 is a schematic diagram showing an image forming apparatus of one embodiment in the present disclosure.

Firstly, as refer to FIG. 1, the configuration of image forming apparatus 1 related to the embodiment of the present disclosure is explained in detail.

According to FIG. 1, image forming apparatus 1 of the present embodiment includes manuscript reading part 2, manuscript feeding part 3, body part 4, stack tray 5, and operation panel part 6 (input part).

Manuscript reading part 2 is allocated above body part 4. Manuscript feeding part 3 is allocated above manuscript reading part 2. Stack tray 5 is allocated in a side of discharge opening 41 for a recording paper provided in body part 4, and operation panel part 6 is allocated in a front-side of body part 4.

Manuscript reading part 2 includes scanner 21, platen glass 22, and manuscript reading slit 23. Scanner 21 has an exposure lamp, imaging sensors, or the like, and is movable transportation direction of the manuscript by manuscript feeding part 3. Platen glass 22 is manuscript stand having transparent members, such as glass. Manuscript reading slit 23 has a slit formed in the transportation direction and orthogonal orientation of the manuscript by manuscript feeding part 3.

When reading the manuscript placed in platen glass 22, scanner 21 is moved to a position that faces platen glass 22. Scanner 21 scans the manuscript placed in platen glass 22, reads a manuscript, and acquires image data. Scanner 21 outputs the acquired image data to image formation part 7 in body part 4.

Also, when reading the manuscript conveyed by manuscript feeding part 3, scanner 21 is moved to a position that faces manuscript reading slit 23. Scanner 21 reads a manuscript thorough manuscript reading slit 23 with synchronizing conveying action of the manuscript by manuscript feeding part 3 and acquires image data. Scanner 21 outputs the acquired image data to image formation part 7.

Manuscript feeding part 3 includes manuscript mounting part 31, manuscript discharge part 32, and manuscript transport mechanism 33. Manuscript placed in manuscript mounting part 31 is fed out one at a time in order by manuscript transport mechanism 33. A manuscript is conveyed in a position that faces manuscript reading slit 23 and is discharged by manuscript discharge part 32 after that. Manuscript feeding part 3 is configured to be retractable. By lifting up manuscript feeding part 3, the upper surface of platen glass 22 can be opened.

Body part 4 has image formation part 7. Also, body part 4 includes feeding part 42, paper sheet conveying path 43, conveying roller pair 44, and ejection roller pair 45. Feeding part 42 has a plurality of sheet paper cassettes 421 and feed roller 422. Sheet paper cassette 421 contains recording papers with which size and direction differs from, respectively, in cases where a plurality of the cassettes are mounted. Feed roller 422 feed outs one sheet of the recording paper at a time from sheet paper cassette 421 to paper sheet conveying path 43.

Feed roller 422, conveying roller pair 44, and ejection roller pair 45 operate as a conveyance part. The recording paper is conveyed by the conveyance part. The recording paper fed out to paper sheet conveying path 43 with feed roller 422 is conveyed to image formation part 7 by conveying roller pair 44. Then, the recording paper recorded by image formation part 7 is discharged to stack tray 5 by ejection roller pair 45.

Operation panel part 6 includes display panel 61 and the input part. The input part has switching buttons of operational mode, buttons for instructions, a start key, a numeric keypad, a touch panel, or the like. As operational mode, operation of a copy, FAX transmission, a scanner, or the like, can be specified. Also, the button for instructions of an input part acquires instructions about printing, transmission, reception, storage, or record. That is, operation panel part 6 accepts the indicating input of these various jobs for image forming apparatus 1 by a user.

Also, operation panel part 6 accepts authentication inputs, such as a password by a user.

Image formation part 7 includes photo conductor drum 71, exposure part 72, developing part 73, transfer part 74, and fixing device 8. Exposure part 72 is an optical unit having a laser device, a mirror, a lens, or the like. Exposure part 72 outputs light based on image data, exposes photo conductor drum 71, and forms an electrostatic latent image on a front surface of photo conductor drum 71. Developing part 73 is a development unit that develops the electrostatic latent image formed on photo conductor drum 71 with using toner. Developing part 73 makes the toner image based on the electrostatic latent image form on photo conductor drum 71.

Transfer part 74 makes a recording paper transfer the toner image formed on photo conductor drum 71 by developing part 73. Fixing device 8 heats the recording paper with which the toner image is transferred by transfer part 74 and makes the toner image fix to the recording paper.

Then, the circuit configuration of image forming apparatus 1 is explained.

Figure 2:
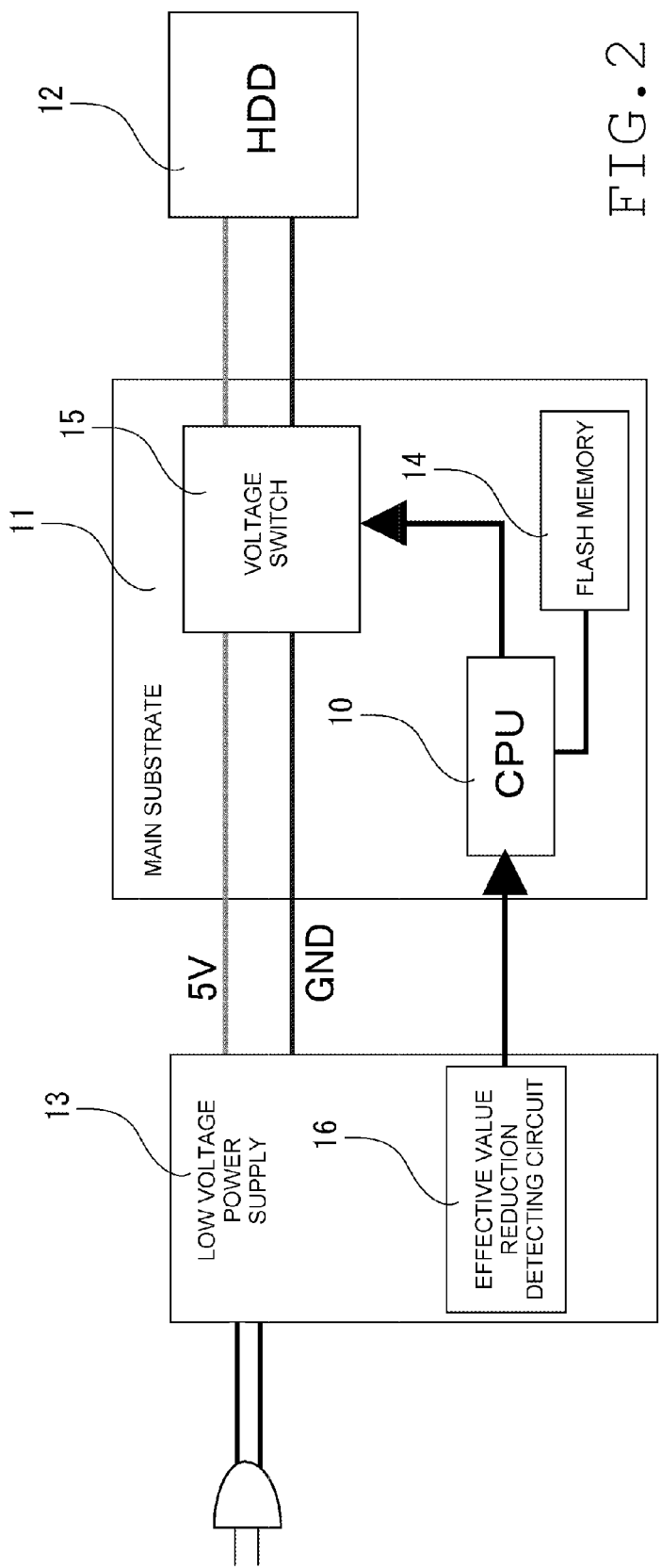
FIG. 2 is a block diagram showing an outline of a circuit configuration of the image forming apparatus in FIG. 1.

FIG. 2 is a schematic diagram showing the circuit configuration of image forming apparatus 1.

Image forming apparatus 1 includes main substrate 11, hard disk 12, and low voltage power supply 13. Main substrate 11 has CPU 10 that controls operation of image forming apparatus 1. Hard disk 12 communicates with CPU 10. Low voltage power supply 13 supplies power supply to circuit mounted in main substrate 11, and hard disk 12. Flash memory 14 and voltage switch 15 are mounted in main substrate 11. In flash memory 14, CPU 10 memorizes data. Voltage switch 15 intercepts the power supply supplied to hard disk 12. Low voltage power supply 13 has effective value reduction detecting circuit 16. In addition, it can be configured that, for the circuit mounted in main substrate 11, a low voltage power is supplied from power supply other than low voltage power supply 13.

CPU 10 executes abnormal recovery process by the instantaneous power failure of the hard disks 12 with effective value reduction detecting circuit 16 as follows. Also, CPU 10 detects the abnormalities of hard disk 12 by the instantaneous power failure. Also, CPU 10 recovers the detected abnormalities.

In addition, CPU 10 and effective value reduction detecting circuit 16 operate as a voltage detecting part in the present disclosure, a voltage drop time measuring part, and a hard disk abnormality determining part. Also, CPU 10 and effective value reduction detecting circuit 16 serve as hardware resources that execute the abnormality detecting method and an abnormality recovery method by the instantaneous power failure of the hard disk in the present disclosure.

Hereinafter, the abnormal recovery process of hard disk 12 by the instantaneous power failure executed with image forming apparatus 1 is explained.

Figure 3A:
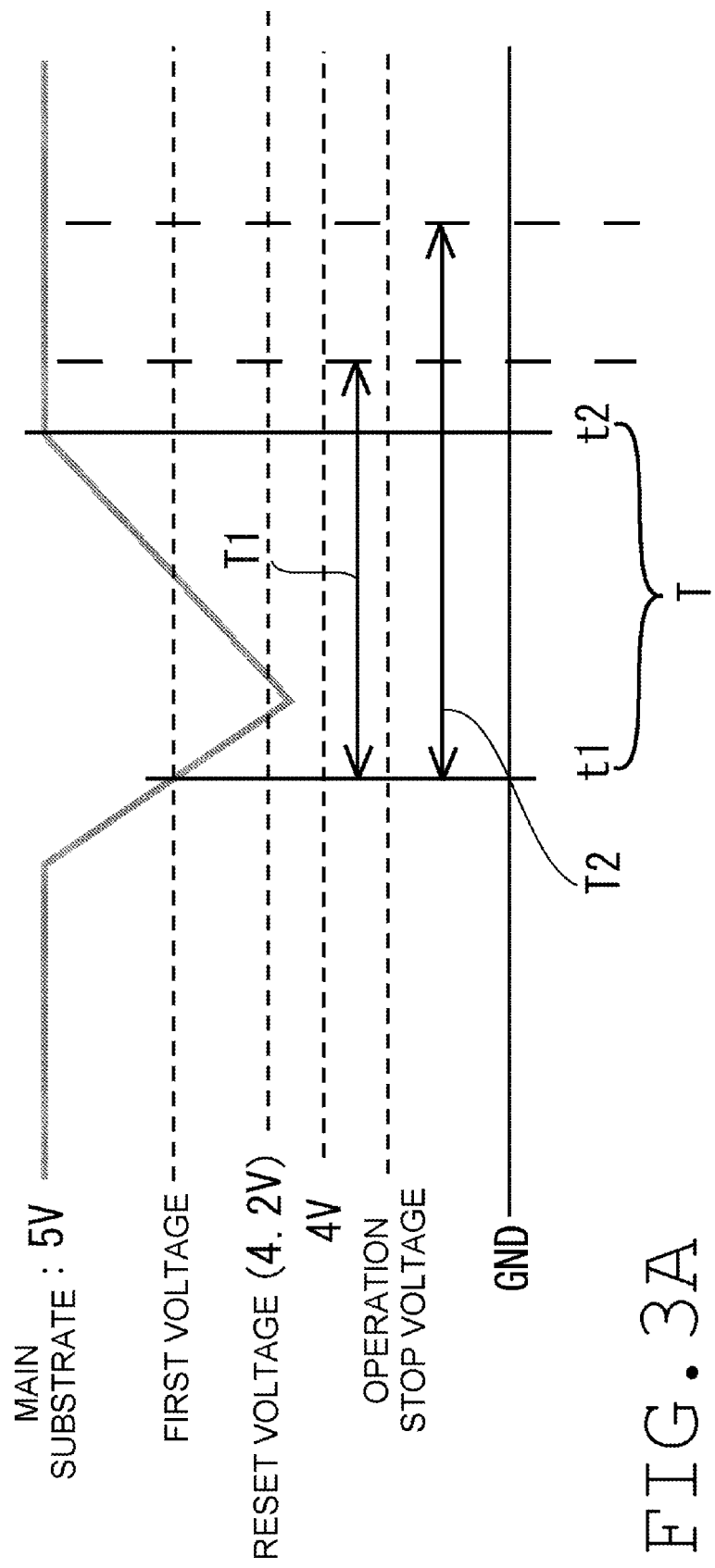
FIG. 3A is a graph showing a relationship between an abnormal recovery of a hard disk and voltage of a low voltage power supply.

In this process, when an instantaneous power failure happens in low voltage power supply 13, the voltage of low voltage power supply 13 starts reduction, and further the voltage of low voltage power supply 13 is less than first voltage as shown in FIG. 3A, effective value reduction detecting circuit 16 transmits a detection signal to main substrate 11. For example, the first voltage is set as voltage, which is higher than the reset voltage (for example, 4.2V) of CPU 10 and lower than proper voltage (for example, 5V.)

In main substrate 11, when a detection signal is transmitted from effective value reduction detecting circuit 16, CPU 10 memorizes the time t1 to flash memory 14. Then, the voltage supplied to low voltage power supply 13 is less than the reset voltage (4.2V) of CPU 10, and if the voltage of low voltage power supply 13 rises as shown in FIG. 3A after that, CPU 10 performs initial operation. In image forming apparatus 1, if supplying less than or equal to reset voltage to CPU 10, CPU 10 will be reset. On this voltage, hard disk 12 is not reset, but hard disk 12 will stop operation if it becomes operation stop voltage, which is lower than 4V, for example, In this case, initial operation will be performed at the time of voltage recovery. If voltage reduces to about 4V, operation of hard disk 12 will be unstable.

When the voltage of the low voltage power supply turns into proper voltage (5V) after that, CPU 10 memorize time t2 at that time in flash memory 14. CPU 10 computes period of time T, which is period from time t1 to time t2 memorized in flash memory 14. Then, CPU 10 determines whether or not computed period of time T is longer than the first period of time T1 and shorter than the second period of time T2. They are configured as specified values defined previously, and, for example, the first period of time T1 is about several 10 msec, and the second period of time T2 is about several 100 msec.

If period of time T between time t1 and time t2 is shorter than the first period of time T1, CPU 10 does not supply the power supply to hard disk 12 again, but it ends the process as it is. This means, as shown in FIG. 3A, since the voltage of low voltage power supply 13 may not reduce about 4V, possibility is low that operation of hard disk 12 is unstable. Here, as for hard disk 12 in the present embodiment, normal operation may not be secured if low voltage power supply 13 becomes less than 4V, for example.

Figure 3B:
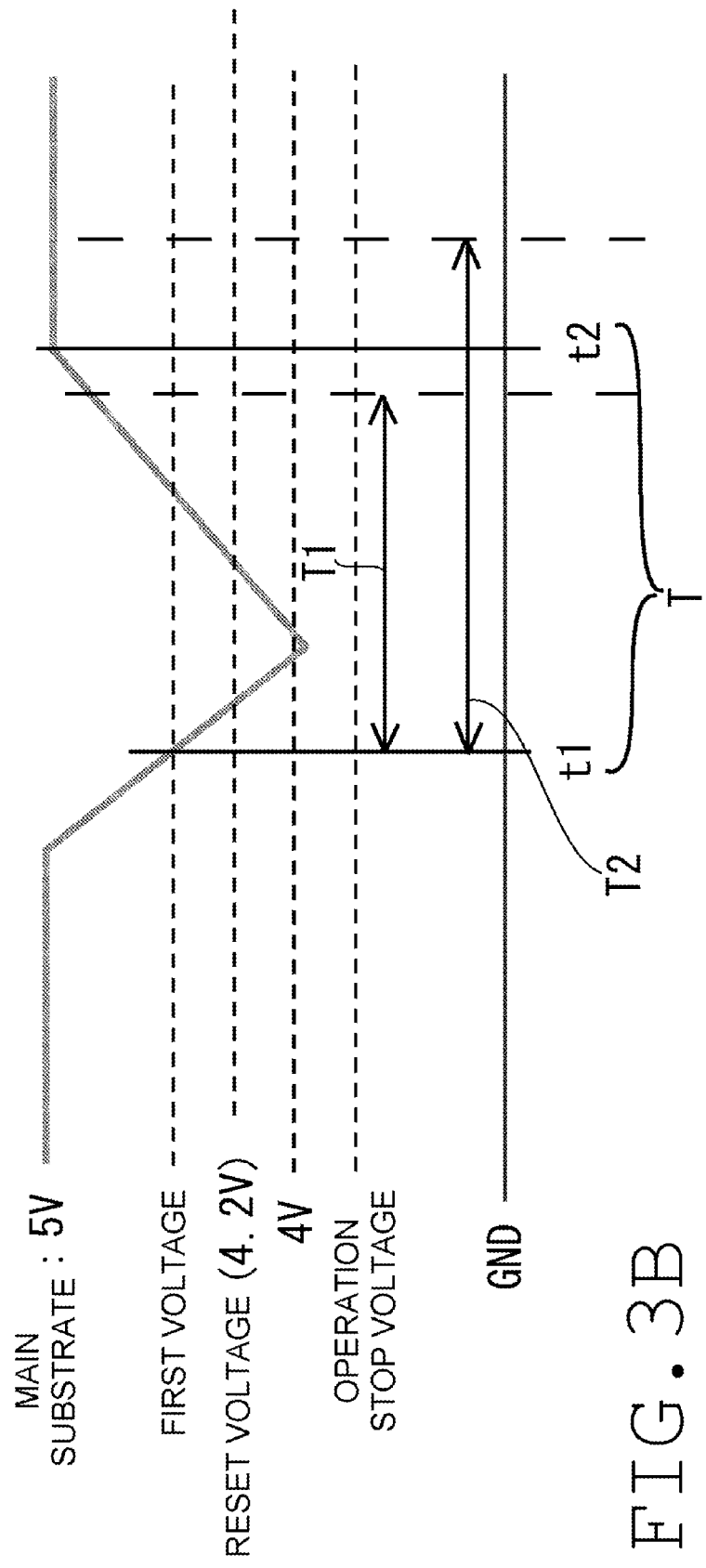
FIG. 3B is a graph showing a relationship between an abnormal recovery of the hard disk, and voltage of the low voltage power supply.

If computed period of time T is longer than the first time (the first threshold) T1 and shorter than the second time (the second threshold) T2, as shown in FIG. 3B, low voltage power supply 13 may be fallen about 4V. However, possibility is high that hard disk 12 does not stop operation but operation of hard disk 12 is in the unstable state. Therefore, CPU 10 determines that hard disk 12 is abnormal. CPU 10 operates voltage switch 15 and supply power to hard disk 12 again (re-supply.) By being performed re-supply power to hard disk 12, unstable operation of hard disk 12 can be returned to normal.

Figure 3C:
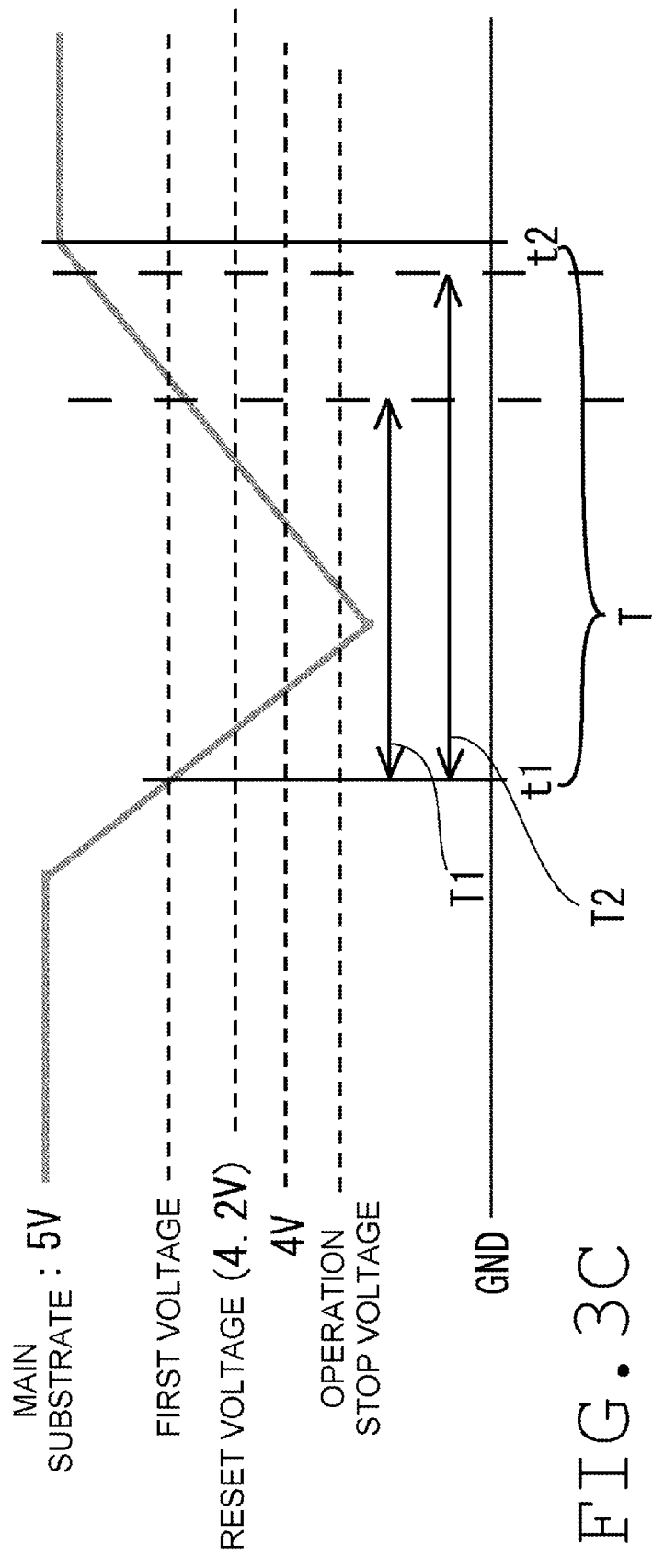
FIG. 3C is a graph showing a relationship between an abnormal recovery of the hard disk, and voltage of the low voltage power supply.

If computed period of time T is longer than the second period of time T2, as shown in FIG. 3C, low voltage power supply 13 may be much lower than 4V and may be lower than operation stop voltage.

In this case, a possibility is high that hard disk 12 stops operation and is a state where hard disk 12 will perform initial operation after instantaneous power failure recovery. Therefore, CPU 10 does not re-supply power to hard disk 12, but it ends a process as it is.

The following effects can be acquired with configuring as mentioned above.

In the example of typical technology, if an instantaneous power failure happens in the low voltage power supply that supplies power supply to CPU and hard disk, the voltage of the low voltage power supply will reduce gradually. If the voltage of the low voltage power supply reduces about 4V, operation will become unstable, and the hard disk will stop operation if much less than 4V. When operation of the hard disk stops, initial operation is performed at the time of recovery of the instantaneous power failure. In this case, initial operation is not performed in the state that operation is unstable, and there is a possibility unable to communicate with CPU.

In the typical technology, since access to the hard disk is only stopped at the time of a voltage drop and operation of the hard disk does not stop, operation of the hard disk is unstable after voltage recovery. Also, even in other typical technologies, a physical sector is protected from power off during data write to the hard disk, and data loss is suppressed only. In this case, a possibility that operation of the hard disk may become unstable after the voltage drop. Also, with the other typical technology, to prevent the oscillation that happens at the time of power failure detection, corresponding to the length of time when absolute value of an instantaneous value of alternating voltage turned into less than or equal to set value, the instantaneous power failure and power failure are only detected. Therefore, it cannot be prevented unstable operation of the hard disk by the power failure.

In contrast for the above, according to the present disclosure, detection of the abnormalities by the instantaneous power failure of the hard disk and recovery of the hard disk that abnormalities is happen are performed automatically. Therefore, it can prevent being impossible to access the hard disk by an instantaneous power failure.

In detail, according to the present embodiment, detection of the abnormalities by the instantaneous power failure of hard disk 12 is performed automatically, when the abnormality is detected, a compulsory re-supply of power-supply is performed, automatically. Thus, it can prevent a situation that CPU 10 becomes unable to access hard disk 12 by an instantaneous power failure.

Also, according to the present embodiment, also in cases where the voltage of low voltage power supply 13 reduces by causes other than instantaneous power failures, such as rush current of other apparatus, it can prevent that CPU 10 becomes unable to access hard disk 12.

In addition, in the above-mentioned embodiment, although it explains a case where low voltage power supply 13 has effective value reduction detecting circuit 16, it may be mounted in main substrate 11. Also, in the above-mentioned embodiment, a case where the first time is defined about several 10 msec, and the second time is defined about several 100 msec is explained. However, since these time is set according to voltage to which operation of hard disk 12 becomes unstable or the how to change the voltage of low voltage power supply 13, it is not limited to the time in the above-mentioned embodiment.

Also, the configuration and operation of the above-mentioned embodiment are an example, it cannot be overemphasized that it can change suitably and can perform in the range that does not deviate from the aim of the present disclosure.

What is claimed is:

1. A storage apparatus comprising: a CPU; a hard disk that communicates with the CPU;
    a low voltage power supply that provides a voltage to the hard disk;
    a voltage detecting part that detects the voltage of the low voltage power supply;
    a voltage drop time measuring part that memorizes a time that the voltage detected by the voltage detecting part is less than a specified voltage which is higher than a reset voltage of the CPU;
    a voltage recovery time measuring part that memorizes a time that the voltage of the low voltage power supply recovers to a proper voltage; and
    a hard disk abnormality determining part that determines the hard disk is abnormal when a period from the time memorized by the voltage drop time measuring part to the time memorized by the voltage recovery time measuring part is within a range from a first threshold to a second threshold.

2. The storage apparatus according to claim 1, further comprising:
    a power supply re-supply part that supplies the power of the power supply to the hard disk again if the hard disk abnormality determining part discriminates that the hard disk is abnormal.

3. An image forming apparatus having the storage apparatus according to claim 1.

4. An abnormality detecting method for an instantaneous power failure of a hard disk that communicates with a CPU, including:
    a voltage detection step for detecting a voltage provided to the hard disk by a low voltage power supply provided to the hard disk;
    a voltage drop time measurement step for memorizing a time that the voltage detected by the voltage detection step is less than a specific voltage which is higher than a reset voltage of the CPU;
    a voltage recovery time measurement step for memorizing a time that the voltage of the low voltage power supply recovers to a proper voltage; and
    a hard disk abnormality determining step for determining the hard disk is abnormal when a period from the time memorized in the voltage drop time measuring step to the time memorized in the voltage recovery time measuring step is within a range from a first threshold to a second threshold.

5. An abnormality recovery method for an instantaneous power failure of a hard disk that communicates with a CPU, including:
    a voltage detection step for detecting a voltage provided to the hard disk by a low voltage power supply;
    a voltage drop time measurement step for memorizing a time that the voltage detected by the voltage detection step is less than a specific voltage which is higher than the a reset voltage of the CPU;
    a voltage recovery time measurement step for memorizing a time that the voltage of the low voltage power supply recovers to a proper voltage;
    a hard disk abnormality determining step for determining the hard disk is abnormal when a period from the time memorized in the voltage drop time measuring step to the time memorized in the voltage recovery time measuring step is within a range from a first threshold to a second threshold; and
    a power supply re-supply step for supplying the power of the power supply to the hard disk again if the hard disk is determined to be abnormal by the hard disk abnormality determining step.

\* \* \* \* \*